United States Patent
Böttner et al.

(10) Patent No.: US 7,038,255 B2
(45) Date of Patent: May 2, 2006

(54) INTEGRATED CIRCUIT ARRANGEMENT HAVING PNP AND NPN BIPOLAR TRANSISTORS, AND FABRICATION METHOD

(75) Inventors: Thomas Böttner, München (DE); Stefan Drexl, Moorenweis-Eismerszell (DE); Thomas Huttner, Marktoberdorf (DE); Martin Seck, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/873,855

(22) Filed: Jun. 21, 2004

(65) Prior Publication Data

US 2005/0029624 A1   Feb. 10, 2005

(30) Foreign Application Priority Data

Jun. 21, 2003   (DE) .................. 103 28 008

(51) Int. Cl.
*H01L 31/109* (2006.01)
(52) U.S. Cl. ....................... 257/197; 438/235
(58) Field of Classification Search ................ 257/197, 257/198; 438/235, 309, 312
See application file for complete search history.

(56) References Cited

U.S. PATENT DOCUMENTS

| 3,611,067 A | 10/1971 | Oberlin et al. .......... 317/235 R |
| 2002/0168829 A1 | 11/2002 | Bock et al. ................. 438/309 |

FOREIGN PATENT DOCUMENTS

| DE | 197 02 320 A1 | 7/1998 |
| EP | 0 137 906 | 4/1985 |
| EP | 1 039 532 A2 | 9/2000 |
| FR | 1448776 | 11/1964 |
| GB | 1121495 | 7/1968 |

*Primary Examiner*—Douglas W Owens

(74) *Attorney, Agent, or Firm*—Brinks Hofer Gilson & Lione (57) ABSTRACT

An explanation is given of, inter alia, an integrated circuit arrangement (100) containing an npn transistor (102) and a pnp transistor (104). Transistors with outstanding electrical properties are produced if the pnp transistor contains a cutout (142) for an edge terminal region (120) and if the edge terminal region (120) has a part near the substrate which is arranged in the cutout (142) and a part remote from the substrate which is arranged outside the cutout (142) and overlaps the base terminal region (139).

13 Claims, 4 Drawing Sheets

INTEGRATED CIRCUIT ARRANGEMENT HAVING PNP AND NPN BIPOLAR TRANSISTORS, AND FABRICATION METHOD

CLAIM TO PRIORITY

This application claims priority of German patent application number 10328008.1, filed Jun. 21, 2003, which is incorporated herein in its entirety by this reference.

BACKGROUND

The invention relates to an integrated circuit arrangement containing at least one npn bipolar transistor and a pnp bipolar transistor. The npn bipolar transistor contains, in the following order in a manner adjoining one another:
- an n-doped first edge region, which is also referred to as a collector region,
- a p-doped base region, and
- a further n-doped edge region, which is also referred to as an emitter region.

The pnp bipolar transistor contains, in the following order in a manner adjoining one another:
- a p-doped edge region, which is also referred to as a collector region,
- an n-doped base region, and
- a further p-doped edge region, which is also referred to as an emitter region.

The emitter regions are usually doped more highly than the collector regions. The doping of the base region is usually higher than the doping of the emitter region.

The edge regions and the base region of a transistor are arranged in monocrystalline semiconductor material. Situated in a base terminal region is a cutout, below which the base region of the pnp transistor is arranged. In the case of the npn transistor, a monocrystalline layer is produced in a cutout of an insulating layer in order to improve the electrical properties of the transistor, for example the so-called transition frequency, for example through the use of two mutually adjoining monocrystalline layers with mutually different basic material.

Such an integrated circuit arrangement is disclosed for example in the German patent specification DE 199 58 062 C2, wherein an additional siliciding is also carried out, but the latter may also be omitted.

BRIEF SUMMARY

It is an object of the invention to specify an integrated circuit arrangement that is simple to fabricate and has npn and pnp bipolar transistors having, in particular, good electrical properties. Moreover, the intention is to specify a fabrication method.

The circuit arrangement according to the invention has the following features in addition to the features mentioned in the introduction:
- an edge terminal region for one edge region of the pnp transistor, in particular for the emitter, is arranged in the cutout of the base terminal region, and
- the edge terminal region has a part near the substrate which is arranged in the cutout and a part remote from the substrate which is arranged outside the cutout and is arranged further away from the substrate than the part near the substrate and overlaps the base terminal region.

As a result, the effective width of the edge region or of the emitter region is not influenced by the width of the part remote from the substrate. Moreover, the edge terminal region can be patterned without the substrate serving as an etching stop. What is more, the fabrication of the npn transistor also impairs the electrical properties of the pnp transistor to a lesser extent, since the substrate of the pnp transistor can be protected by the base terminal region and by the edge terminal region before e.g. a long overetching is carried out for fabricating the npn transistor. Further technical effects are explained below with reference to the descriptions of the figures.

In one development, a different basic material is used for the base region of the npn transistor than for the base region of the pnp transistor. The electrical properties, e.g. the transition frequency, of the npn transistor are thereby improved considerably, but without impairing the electrical properties of the pnp transistor. Circuits having pnp and npn transistors thus become attractive again. By way of example, a constant current source connected to the positive operating voltage can be fabricated more simply with pnp transistors than just with npn transistors.

In another development, the insulating layer for accommodating the base region of the npn transistor also extends into the region of the pnp transistor and is used there for insulating purposes or leveling purposes without performing additional method steps during fabrication.

In another development, mutually different spacer elements or so called spacers are used in the cutout of the pnp transistor and in the cutout of the npn transistor. This makes it possible to optimize the spacers in each case with regard to the pnp transistor and with regard to the npn transistor without compromises in respect of the other transistor.

In a next development, the edge region of the pnp transistor that is further away from the cutout is formed with the aid of a doping region having the same contour as the cutout. In other words, this means that the cutout has been used as an implantation mask. The cutout thus has a further function. Such methods are also referred to as SIC methods (selectively implanted collector). The SIC method makes it possible to produce a small collector region without an additional mask. On account of the small collector region, the parasitic base collector capacitance is considerably reduced in comparison with a wider collector. The electrical properties of the pnp transistor are improved further. This increases the incentive to use circuits containing both npn and pnp transistors. By way of example, current sources at positive potential can be realized more simply with pnp transistors than with npn transistors. An SIC method in the context of the simultaneous fabrication of npn and pnp transistors has been possible hitherto only in the area of the npn transistor.

In a next development of the circuit arrangement according to the invention, the pnp transistor is formed as a multi-emitter transistor containing at least two cutouts adjoined, outside the respective cutout, by electrically conductive material of the terminal region of an emitter. In the case of the circuit arrangement according to the invention, the width of the emitter can be reduced in comparison with previous pnp transistors in circuits with npn transistors. A small emitter width brings about good radiofrequency properties of the transistor, but reduces the maximum permissible switching current. In order nevertheless to be able to switch larger currents, the arrangement of a plurality of emitter regions next to one another also becomes attractive, the chip area required overall being small on account of the reduced emitter width. Multi-emitter pnp transistors with good radiofrequency properties and high switchable current intensities can thus be fabricated on a small chip area.

In another development, the dopings contained in the circuit arrangement according to the invention are of the opposite type to the types specified above. Accordingly, the pnp transistor would become an npn transistor, for example.

The invention relates, in a further aspect, to a method for fabricating an integrated circuit arrangement, in particular the circuit arrangement according to the invention or one of its developments. The technical effects mentioned above thus also apply to the method according to the invention and its developments. The following steps are carried out in the case of one embodiment of the method according to the invention:

application of an electrically conductive layer or of a layer that can be converted into such a layer to a substrate,
application of an electrically insulating covering layer after the application of the electrically conductive layer,
joint patterning of the electrically conductive layer and of the covering layer to produce at least one cutout, below which the base region of the pnp transistor has been arranged or is arranged,
application of an electrically insulating insulating layer after the patterning of the electrically conductive layer,
patterning of the insulating layer to produce at least one further cutout, below which the base region of the npn transistor has been arranged or is arranged.

BRIEF DESCRIPTION OF THE DRAWINGS

Exemplary embodiments of the invention are explained below with reference to the accompanying drawings, in which.

DETAILED DESCRIPTION OF THE PRESENTLY PREFERRED EMBODIMENTS

Figure 1:
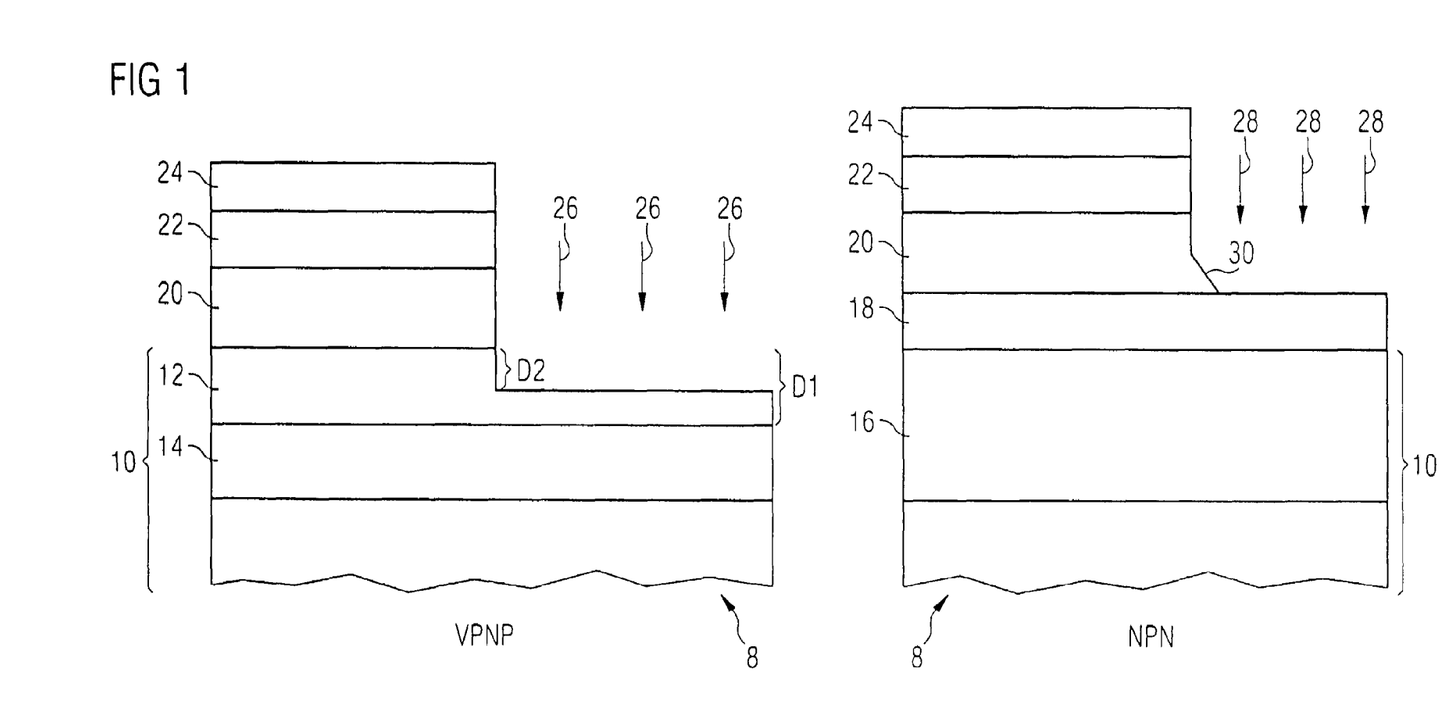
FIG. 1 shows the incipient etching of a base terminal region of a pnp transistor during simultaneous overetching in the region of an npn transistor.

FIG. 1 shows the fabrication of an integrated circuit arrangement 8 in accordance with the German patent specification DE 19958062 C2. The integrated circuit arrangement 8 contains an n-doped substrate (not illustrated) made of silicon. In the substrate or on an n-type epitaxial layer 10 arranged on the substrate, an n-doped doping region 12 is situated in the region of the pnp transistor at the surface of the n-type epitaxial layer 10, which doping region later forms the base terminal region of the pnp transistor. The dopant concentration in the doping region 12 is, for example, $10^{18}$ dopant atoms per $cm^3$ (cubic centimeter), so that the doping region 12 is suitable for forming a base region of the pnp transistor. Situated below the doping region 12 is a doping region 14, in which a basic doping of the n type epitaxial layer of, for example, $10^{17}$ doping atoms per $cm^3$ is present.

In the region of the npn transistor, a doping region 16 is situated at the surface of the n type epitaxial layer 10, which doping region is n-doped and has a doping of $10^{17}$ doping atoms per $cm^3$, for example. The doping region 16 contains the collector region of the npn transistor.

An insulating layer 18, which for example has a thickness of 100 nm and comprises silicon dioxide, is situated on the substrate or on the n type epitaxial layer 10. The insulating layer 18 has a large area cutout in the region of the pnp transistor, and so it is not illustrated in FIG. 1. By contrast, the insulating layer 18 is present and still unpatterned in the region of the npn transistor, in particular above the doping region 16.

After the application of the insulating layer 18, a heavily p-doped polycrystalline silicon layer 20 was deposited over the whole area, which layer is referred to hereinafter for short as polysilicon layer 20. By way of example, there are $10^{20}$ doping atoms per $cm^3$ in the polysilicon layer 20. In the region of the pnp transistor, the polysilicon layer 20 bears on the doping region 12 on account of the insulating layer 18 being absent there. In the region of the npn transistor, by contrast, the polysilicon layer 20 bears on the insulating layer 18.

An insulating covering layer 22 was applied above the polysilicon layer 20 in a whole area manner. Afterward, photoresist 24 was applied to the covering layer 22, exposed and developed, with the result that the regions of the photoresist 24 which are illustrated in FIG. 1 have remained, i.e. above an emitter terminal region of the pnp transistor and above a base terminal region of the npn transistor.

An etching is subsequently carried out for the purpose of patterning the covering layer 22 and for the purpose of patterning the underlying polysilicon layer 20, for example with the aid of reactive ion etching, see arrows 26 and 28. The reactive ion etching is carried out during the etching of the polysilicon layer 20 selectively with respect to the insulating layer 18. In order to completely eliminate oblique sidewalls 30 of the polysilicon layer 20 in the region of the npn transistor, a high degree of overetching would be necessary. However, the doping region 12 would be severed in the region of the pnp transistor on account of the high degree of overetching during the etching of the polysilicon layer 20. Therefore, only a weak degree of overetching is effected, the doping region 12 being incipiently etched and its original thickness D1 thus being reduced by a thickness D2, e.g. by more than 5 nanometers or by more than 10 nanometers. What is more, the selectivity in the region of the pnp transistor during the etching of the polysilicon layer 20 is considerably lower, on account of the silicon lying below the polysilicon layer 20, than the selectivity in the region of the npn transistor, where the insulating layer 18 made of silicon dioxide lies below the polysilicon layer 20.

In accordance with the prior art, in order to achieve a synergistic effect, use is made of the npn emitter poly for the contact connection of the pnp base. The inner spacer of the npn transistor is used for emitter/base insulation for the pnp transistor. In this case, the pnp base poly has to be pulled over the emitter in order to enable an etching stop on oxides. The positional error tolerances of the contact connection limit the minimum emitter width in the case of the prior art. The emitter width and the incipient etching are thus factors which make optimization of the pnp transistor considerably more difficult.

Figure 2:
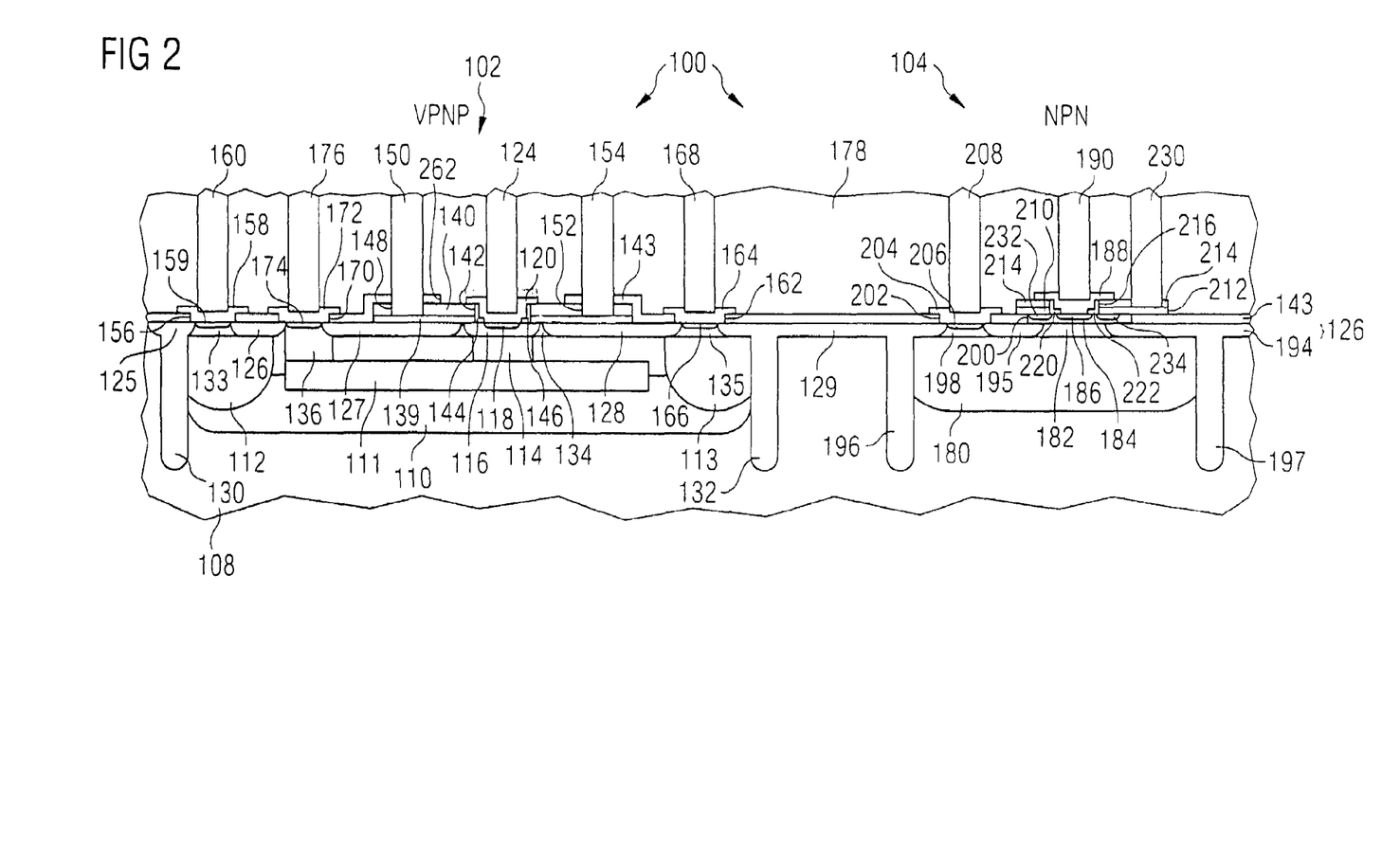
FIG. 2 shows an integrated circuit arrangement having a pnp transistor and an npn transistor.

FIG. 2 shows an integrated circuit arrangement 100, the fabrication of which no longer manifests the problems explained with reference to FIG. 1. The integrated circuit arrangement 100 contains a pnp transistor 102 illustrated in the left hand part of FIG. 2 and an npn transistor 104 illustrated in the right hand part of FIG. 2. Both transistors 102 and 104 are vertical transistors in which the active emitter region, the base region and the active collector region are arranged vertically if a substrate surface of the substrate 108 that carries the transistor is situated horizontally, i.e. the active regions are lined up in a direction normal to a main area of the substrate 108, a main area being an area containing a considerably larger amount of area than, for example, an edge area of the substrate 108.

The transistors 102 and 104 may be arranged both adjacent to one another and in circuit parts of the integrated circuit arrangement 100 that are far away from one another. By way of example, a plurality of other components lie between the two transistors 102 and 104.

Proceeding from a substrate 108, with increasing distance from the substrate 108, the transistor 102 contains, in the specified order in a manner adjoining one another:

an n-doped well 110,
a p-doped buried collector lead layer 111,
a monocrystalline p-doped collector region 114,
a monocrystalline n-doped base region 116,
a monocrystalline p-doped emitter region 118,
a heavily p-doped polycrystalline emitter terminal region 120, for example made of polysilicon, and
a metallic emitter terminal 124, for example made of tungsten.

The n-doped well 110 is connected via two vertical doping regions 112 and 113. Shallow isolating trenches, of which seven isolating trenches 125 to 129 and 194 and 195 are illustrated in FIG. 2, are arranged in the epitaxial layer 126 or in a surface of the substrate 108. By way of example, the depth of the shallow isolating trenches is less than one micrometer. The shallow isolating trenches 125 to 129 for example penetrate completely through the n type epitaxial layer 126. An isolation trench 127 arranged between said isolation trenches 126 and 128 serves to insulate an n type doping region 134 for accommodating the base region 116 from a p type doping region 136 for the connection of the buried p type collector lead 111. Situated between the isolating trenches 125 and the isolating trench 126 is an n type doping region 133 leading to the vertical doping region 112. Situated between the isolating trenches 128 and 129 is an n type doping region 135 leading to the vertical doping region 113. Deep isolating trenches 130 and 132, which are deeper than one micrometer, for example, penetrate through the isolating trenches 125 and 129.

A base terminal region 139 made of heavily n-doped polycrystalline silicon with a layer thickness of 200 nm, for example, is situated on the isolating trenches 127 and 138 and also on the intervening doping region 134 and on parts of the base region 116. A covering layer 140, which for example has a thickness of 100 nm and comprises silicon oxide, is arranged on the base terminal region 139. The base terminal region 139 and the covering layer 140 contain a cutout 142 for accommodating the polycrystalline emitter terminal region 120 and two spacers 144 and 146 made of electrically insulating material, for example made of silicon dioxide and/or silicon nitride. The spacers 144 and 146 may have been produced either as single spacers made from an insulating layer 143 or as double spacers made from two layers comprising mutually different materials. The insulating layer 143 also bears on the covering layer 140 and contains a cutout 262 for that part of the emitter terminal region 120 which is arranged outside the cutout 142.

The covering layer 140 additionally contains, on both sides of the cutout 142, cutouts 148 and 152 for metallic base terminals 150 and 154, which adjoin the base terminal region 139. The base terminals 150 and 154 also penetrate through the insulating layer 143 bearing on the covering layer 140.

The insulating layer 143 also extends above the n-type well 110 and in the region of the doping region 136 for the connection of the collector lead 111. At the left-hand edge of the n-type well 110 above the vertical doping region 112 and above the n-type doping region 133, a cutout 156 is situated in the insulating layer 143, a heavily n-doped well terminal region 158 made of polycrystalline silicon being arranged in said cutout. An n-doped diffusion region 159 is situated between the n type doping region 133 and the well terminal region 158. The diffusion region 159 is produced by outdiffusion of dopants from the well terminal region 158. The well terminal region 148 is connected with the aid of a metallic well terminal 160.

At the right hand edge of the n type well 110 above the vertical doping region 113 and above the n type doping region 135, a cutout 162 is situated in the insulating layer 143, a heavily n-doped well terminal region 164 made of polycrystalline silicon being arranged in said cutout. An n-doped diffusion region 166 is situated between the n type doping region 135 and the well terminal region 164. The diffusion region 166 is produced by outdiffusion of dopants from the well terminal region 164. The well terminal region 164 is connected with the aid of a metallic well terminal 168.

In the region of the collector terminal above the p type doping region 136, a cutout 170 is situated in the insulating layer 143, a heavily p-doped collector terminal region 172 made of polycrystalline silicon being arranged in said cutout. A p-doped diffusion region 174 is situated between the p type doping region 136 and the collector terminal region 172. The diffusion region 174 is produced by outdiffusion of dopants from the collector terminal region 172. The collector terminal region 172 is connected with the aid of a metallic collector terminal 176.

The emitter terminal 124, the base terminals 150, 154, the collector terminal 176 and the well terminals 160 and 168 lie in an intermediate layer insulating layer 178 comprising silicon dioxide, for example. Further metallization layers for the connection of the transistor 102 are not illustrated in FIG. 2.

Proceeding from the same substrate 108, with increasing distance from the substrate 108, the npn transistor 104 contains, in the specified order in a manner adjoining one another:

an n-doped buried collector lead 180,
a monocrystalline n-doped collector region 182,
a monocrystalline p-doped base region 184,
a monocrystalline n-doped emitter region 186,
a heavily n-doped polycrystalline emitter terminal region 188, and
a metallic emitter terminal 190.

The transistor 104 is laterally insulated by the isolating trench 129 and the isolating trench 194. A shallow isolation trench 195 is arranged between the isolation trenches 129 and 194 and insulates the collector region 182 from an n-doped doping region 198. The doping region 198 serves for the connection of the buried collector lead 180. A further deep isolating trench 196 penetrates through the shallow isolating trench 129. A deep isolating trench 197 penetrates through the isolating trench 194.

The insulating layer 143 is likewise arranged on the isolating trenches 129, 195 and 194 as well. In the region of the npn transistor 104, the insulating layer 143 has a cutout 200, in which is arranged a silicon-germanium layer grown by selective epitaxy. The cutout 200 and thus the silicon germanium layer contains the base region 184 and the emitter region 186 of the npn transistor 104.

In the insulating layer 143, a cutout 202 is additionally situated in the region of the npn transistor 104, a heavily n-doped polycrystalline collector terminal region 204 made of silicon, for example, being arranged in said cutout. The dopant of the collector terminal region 204 has partly been diffused into the substrate 108, where it forms a diffusion region 206 adjoining the doping region 198. The collector terminal region 204 is connected via a metallic collector terminal 208.

Moreover, two p-doped polycrystalline regions 210 and 212 made of polycrystalline silicon are arranged, in a manner overlapping the edge of the cutout 200, on the insulating layer 143 and on the silicon germanium layer in the region of the npn transistor 104. The polycrystalline regions 210 and 212 are covered by residual regions of a covering layer 214. The polycrystalline region 212 is connected via a metallic base terminal 230.

Spacers 220 and 222 are arranged in a cutout 216 at the side areas of the polycrystalline regions 210, 212 and the regions of the covering layer 214, said spacers adjoining the polycrystalline emitter terminal region 188. The spacers 220 and 222 are likewise single spacers or double spacers.

From the doped polycrystalline regions 210 and 212, dopants have penetrated into the silicon germanium region arranged within the cutout 200, where they form doping regions 232 and 234 for the connection of the base region 184. The emitter region 186, too, has been produced by outdiffusion of dopants but from the emitter terminal region 188.

The transistors 102 and 104 are for example radially symmetrical transistors or transistors whose layers continue rearward or forward perpendicularly to the plane of the page.

Figure 3:
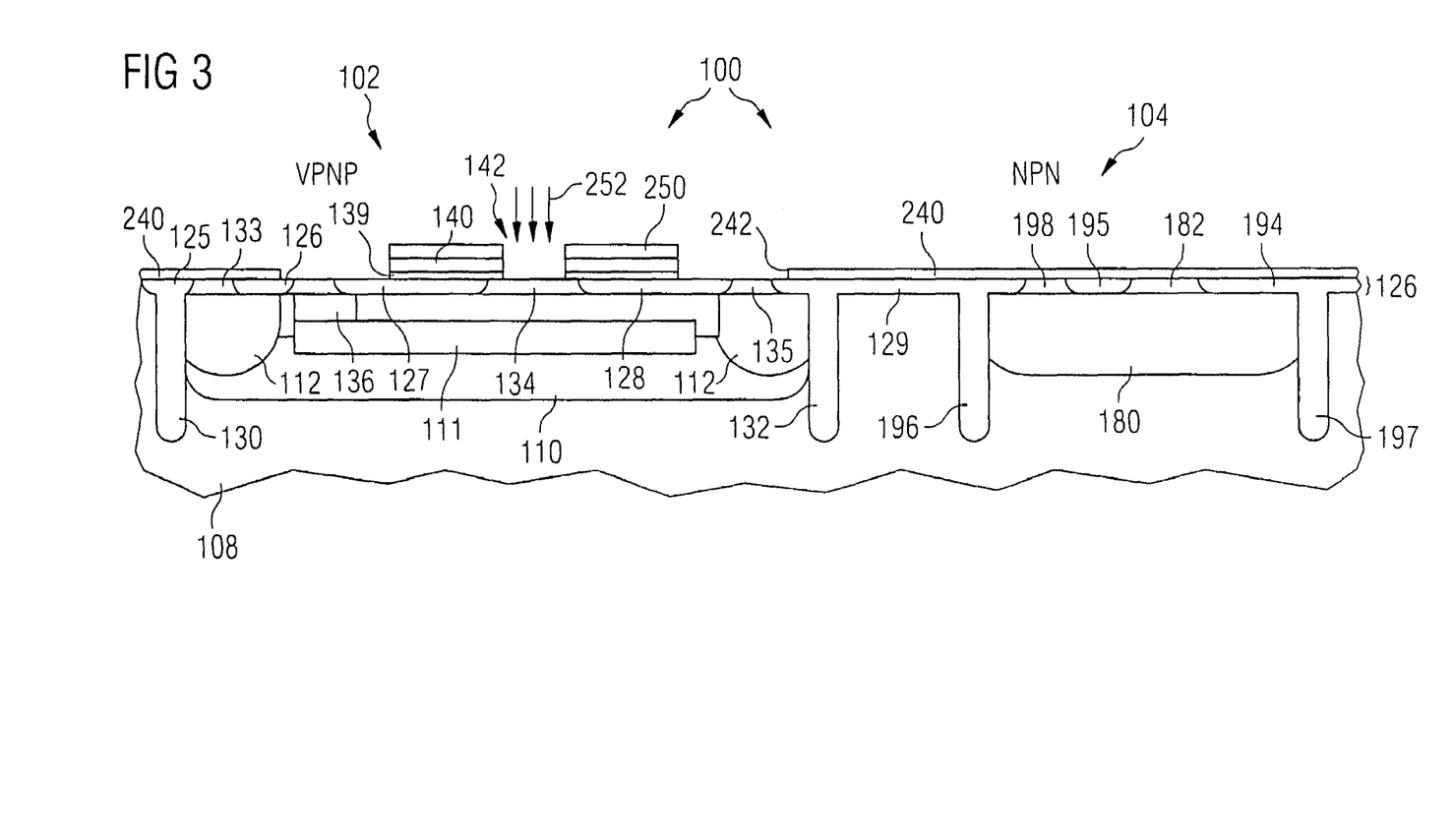
FIGS. 3 to 5 show fabrication stages in the fabrication of the circuit arrangement shown in FIG. 2.

FIG. 3 shows a fabrication stage of the integrated circuit arrangement 100. Proceeding from the p-doped substrate 108, firstly the n-doped buried collector lead 180 is produced in the region of the npn transistor 104 by means of implantation and subsequent indiffusion. The n type well 110 is then implanted in the region of the pnp transistor, said well serving to insulate the transistor 102 from the substrate 108.

Afterward, by means of whole area epitaxy, the n-type epitaxial layer 126 is applied with a dopant concentration of e.g. $10^{17}$ cm$^{-3}$. As an alternative, no epitaxial layer is applied if the regions 110 and 180 are implanted with higher energy. The shallow isolating trenches 125 to 129 and 194 and 195 are then formed in the epitaxial layer 126 with the aid of a photolithographic process, for example with the aid of a reactive ion etching. The deep isolating trenches 130, 132, 196 and 197 are subsequently fabricated. Afterward, the shallow isolating trenches 125 to 129 and 194 and 195 and also the deep isolating trenches 130, 132, 196 and 197 are filled with silicon dioxide, which is subsequently planarized. As an alternative, instead of the shallow isolating trenches 125 to 129 and 194 and 195, it is also possible to use a LOCOS technique (LOCal Oxidization of Silicon). The shallow isolating trenches 125 to 129 and 194 and 195 also define the position of the doping regions 133 to 135, of the doping region 198 and of the collector region 182 of the npn transistor 102.

A thin screen oxide layer 240 is subsequently applied. The screen oxide layer 240 has a thickness of e.g. 20 nm (nanometers).

The doping region 198 is doped in a subsequent optional implantation step using a photomask (not illustrated). For example with the aid of an implantation and a subsequent diffusion. Said implantation is also referred to as npn collector deep implantation.

Afterward, further additional masks are used to produce the buried collector lead 111 and the p type doping region 136, which serves for the connection of the collector region 114 of the pnp transistor 102. Furthermore, the vertical doping regions 112 and 113 are implanted.

After carrying out these implantation steps, the screen oxide is removed locally. For this purpose, the mask already used for the implantation of the collector lead 111 can again be used in a photolithographic process. A cutout 242 lying above the collector lead 111 of the pnp transistor 102 is produced in the screen oxide layer 240.

In a subsequent method step, an amorphous or polycrystalline silicon layer is deposited, which also contains the later base terminal region 139. Afterward, the covering layer 140 is applied to the still completely unpatterned silicon layer, for example by means of a TEOS method (tetraethyl orthosilicate).

A photoresist layer 250 is then applied to the covering layer 140. The photoresist layer 250 is selectively exposed and developed in order to define the position of the cutout 142 and of the base terminal region 139. Afterward, the cutout 142 is etched and the polycrystalline silicon layer and also the covering layer 140 are removed in the regions that do not form the base terminal region 139, for example with the aid of a reactive ion etching process, see arrows 252, or wet chemically. In this case, the substrate 108 is only slightly incipiently etched below the cutout 142, i.e. in the future pnp emitter region. In particular, long overetching is not necessary. As an alternative, it is also possible to use a hard mask, in particular a silicon nitride hard mask, for patterning the polycrystalline silicon layer and the covering layer 140. The residues of the photoresist layer 250 and, if appropriate, the hard mask, are removed again after the patterning of the base terminal region 139.

Figure 4:
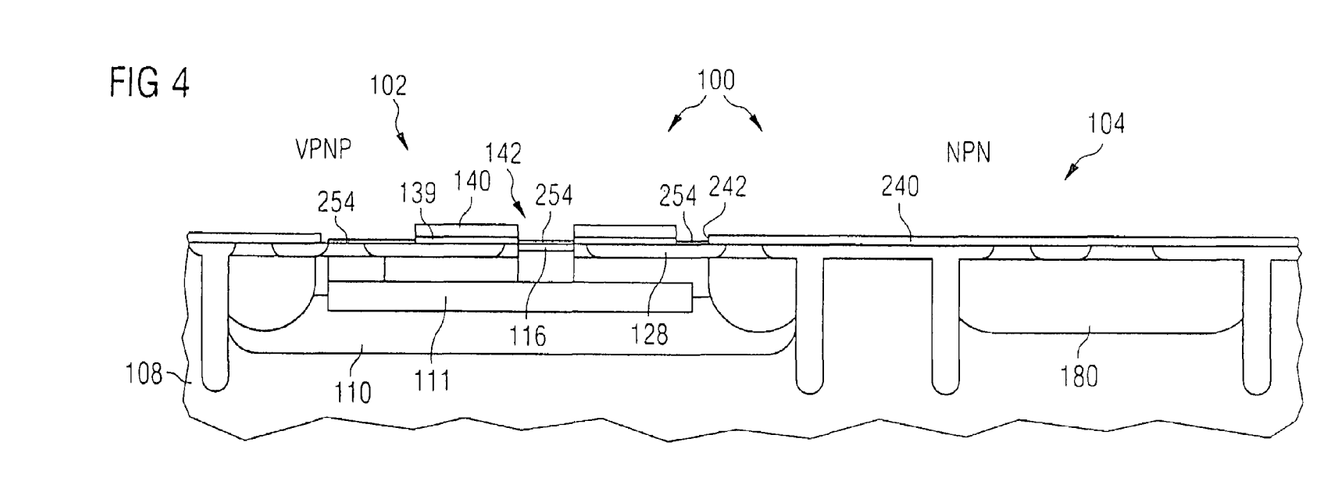

As illustrated in FIG. 4, a thin screen oxide layer 254 is subsequently produced, e.g. by means of a thermal oxidation, within the cutout 242 of the screen oxide layer 240, at the locations not covered by the base terminal region.

The base region 116 is subsequently implanted below the cutout 142 in a self aligning manner without the use of an additional mask or using a mask with large tolerances. The collector region 114 is then implanted in a self aligning manner without the use of an additional mask or using a mask with large tolerances, said collector region likewise being arranged below the cutout 142.

The depth of the base region 116 is thus independent of the overetching during the production of the cutout 142. The connection of the base region 116 is produced by means of an outdiffusion from the n type polysilicon of the base terminal region 139. This outdiffusion is carried out e.g. at a later point in time.

Figure 5:
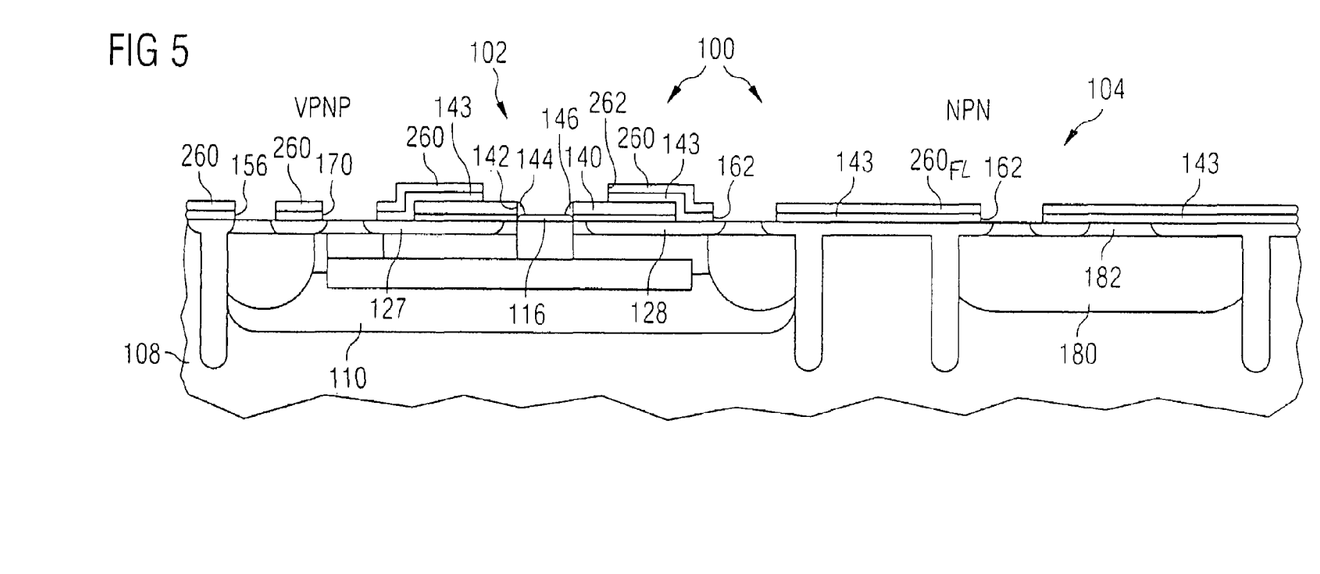

As illustrated in FIG. 5, the screen oxide layers 240 and 254 are removed after the two implantations. Afterward, the insulating layer 143 is deposited over the whole area, e.g. by means of a TEOS method (tetraethyl orthosilicate), with a thickness of e.g. 200 nm.

A photoresist layer 260 is then applied to the insulating layer 143 and selectively exposed in order to define the position of the cutouts 156, 170, 162, 202 and of a cutout 262 on the covering layer 140. The photoresist layer 260 is then developed. The cutouts 156, 170, 162, 202 and 262 are then etched by means of an anisotropic etching process, the spacers 144 and 146 being produced below the cutout 262 in the cutout 142. The anisotropic etching is carried out e.g. dry chemically.

In an alternative exemplary embodiment, e.g. a nitride layer is produced above the insulating layer 143 and is etched anisotropically to produce first regions of double spacers. The insulating layer 143 is then etched isotropically, producing the double spacers. The incipient etching of the pnp base region 116 becomes smaller through the use of double spacers, in particular in the case of wet chemical isotropic etching.

During the production of the spacers 144 and 146, the photoresist layer 260 protects the insulating layer 143 above the collector region 182 from incipient etching. In a further exemplary embodiment, the cutout 262 is situated on the isolating trenches 127 and 128 rather than on the covering layer 140.

As illustrated in FIG. 2 again, the residues of the photoresist layer 260 are subsequently removed. A p-doped polycrystalline silicon layer is deposited. The covering layer 214 is applied to the silicon layer, for example with the aid of a deposition process. Afterward, a photoresist layer (not illustrated) is applied and selectively exposed. The exposed photoresist layer is developed in order to define the boundaries of the polycrystalline emitter terminal region 120, of the polycrystalline collector terminal region 146, of the polycrystalline region 210 and of the polycrystalline region 212. The covering layer 214 and the polycrystalline silicon layer are subsequently patterned with the aid of the patterned photoresist layer, the emitter terminal region 120, the collector terminal region 172, the polycrystalline region 210 and the polycrystalline region 212 being produced from the polycrystalline layer. By way of example, a reactive ion etching is used. The insulating layer 143 serves as an etching stop layer for the collector terminal region 172, the polycrystalline region 210 and the polycrystalline region 212. The covering layer 140 serves as an etching stop layer for the emitter terminal region 120. Therefore, even a long overetching does not attack the n-type doping region 134. In the npn transistor 104, the incipient etching of the n type doping region 198 is noncritical.

As can furthermore be seen from FIG. 2, the npn transistor 104 is subsequently completed. In the region of the npn transistor 104, the following are produced, in particular, in the following order:
the spacers 220 and 222, identical spacers (not illustrated) also being produced, as appropriate, at the collector terminal region 172 and at the emitter terminal region,
the cutout 200 by wet chemical etching of the insulating layer 143,
the selective epitaxial layer in the cutout 200,
the collector terminal region 204 and the emitter terminal region 188 from an n-doped polycrystalline silicon layer with the aid of a photolithographic method, the well terminal regions 158 and 162 preferably also being produced at the same time.

A heat treatment is subsequently effected for diffusion of the dopants on the polycrystalline silicon. The emitter region 118, the doping regions 159, 174, 166 and 206, the doping regions 232 and 234 and also the emitter region 186 are produced in the process. At the same time, e.g. the diffusion regions for connection of the base region 116 also diffuse out of the base terminal region 139.

The intermediate layer insulating layer 178 is subsequently applied, planarized and patterned with the aid of a further photolithographic method. The metallic contacts are introduced into the contact holes produced. Further metallization layers are subsequently produced.

In another exemplary embodiment, field-effect transistors are also integrated in the integrated circuit arrangement 100 in addition to the two types of bipolar transistor, thereby producing e.g. a BiCMOS circuit arrangement (Bipolar Complementary Metal Oxide Semiconductor). Further modifications are a multi-emitter transistor, additional collector contacts or else just one metallic base terminal.

By means of the methods explained, a vertical pnp transistor 102 is integrated into a bipolar (BiCMOS) process in a simple manner. The electrical properties of existing components, in particular of the npn transistor 104, are not impaired. Layers and photoplanes required in the fabrication of the npn transistor 104 are also used in large numbers for the fabrication of the pnp transistor 102. A special technology using selective silicon germanium base epitaxy has been explained as an exemplary embodiment. However, the fabrication of the pnp transistor 102 can also be retained in the case of other bipolar processes.

A large synergistic gain arises in the exemplary embodiments because the npn base poly is used as a pnp emitter poly. The npn transistor 104 and the pnp transistor 102 are formed as so called double poly self aligned transistors.

In the case of the methods explained, the pnp base poly no longer has to be pulled over the emitter terminal region in order to enable an etching stop on an oxide layer lying below the emitter terminal region. Consequently, the position error tolerances of the contact connection no longer limit the minimum emitter width. However, even if the pnp base poly is pulled over the emitter poly, this does not impair the minimum emitter width since the emitter terminal region widens towards the top. The cutout 142 in the base terminal region 140 and the spacers 142, 146 arranged in it limit the width of the electrical contact of the emitter terminal region 120 to the emitter region 118 of the pnp transistor 102, so that the width of the contact is small in comparison with the width of that part of the emitter terminal region which is remote from the substrate. The spacers 142 and 146 directly adjoin the emitter terminal region 120.

The use of an n-type poly layer as a pnp base terminal 139 below the covering layer 140 made of oxide affords the following advantages, in particular:
the p-type polysilicon etching can stop on the covering layer 140 and an overetching in the npn emitter window is noncritical,
the emitter width of the pnp transistor 102 can be significantly reduced,
the pnp base link resistance of the pnp transistor 102 is reduced by virtue of the reduction of the incipient etching of the base region,
it is possible to implant the collector of the pnp transistor 102 through the emitter window and thus to greatly delimit it laterally (SIC implantation), which reduces the base collector capacitance,
the additional n type poly layer may also be used as a separate resistance plane or for optimizing other components, e.g. for diodes, capacitances, gate poly or as a wiring plane.

It is therefore intended that the foregoing detailed description be regarded as illustrative rather than limiting, and that it be understood that it is the following claims, including all equivalents, that are intended to define the spirit and scope of this invention.

The invention claimed is:

1. An integrated circuit arrangement (100), having at least one npn transistor (104) containing, in the following order in a manner adjoining one another, a first n-doped edge region (182), a p-doped base region (184) and a further n-doped edge region (186), and having at least one pnp transistor (102) containing, in the following order in a manner adjoining one another, a first p-doped edge region (114), an n-doped base region (116) and a further p-doped edge region 118, the integrated circuit arrangement comprising
a monocrystalline substrate (108) containing the base region (116) of the pnp transistor (102), the edge regions (114, 118) of the pnp transistor and the first edge region (182) of the npn transistor (104), a base terminal region (139), adjoining the substrate (108), for the base region (116) of the pnp transistor (102), and at least one cutout (142) arranged in the base terminal region (139), the base region (116) of the pnp transistor (102) being arranged below said cutout (142), a first edge terminal region (120) for the further edge region (118) of the pnp transistor (102) being arranged in the cutout (142), and the first edge terminal region (120) containing a part near the substrate which is arranged in the cutout (142) and a part remote from the substrate which is arranged outside the cutout (142) and is arranged further away from the substrate (108) than the part near the substrate and overlaps the base terminal region (139).

2. The circuit arrangement (100) of claim 1, further comprising a monocrystalline region which adjoins the substrate (108), contains the base region (184) and the further edge region (186) of the npn transistor (104) and is arranged in a cutout (200) of an insulating layer (143), the monocrystalline region preferably containing a different basic material than the substrate (108), in particular silicon-germanium or silicon-germanium-carbon, while the substrate (108) preferably contains silicon as basic material.

3. The circuit arrangement (100) of claim 2, wherein the insulating layer (143) also extends into the region of the pnp transistor (102), and/or wherein the insulating layer (143) overlaps the base terminal region (139) of the pnp transistor (102), and/or wherein the insulating layer (143) contains at least one cutout (170), in which is arranged a further edge terminal region (172) for the further edge region (114) of the pnp transistor (102), and/or wherein the insulating layer (143) contains at least one cutout (156, 162), in which is arranged a terminal region (158, 164) for a doped layer (110), which is situated between the pnp transistor (102) and the substrate (108).

4. The circuit arrangement (100) of claim 2, featuring at least one electrically insulating spacer element (144, 146) in the cutout (142) of the base terminal region (139), and featuring at least one electrically insulating spacer element (220, 222) in the cutout (200) of the insulating layer (143), one spacer element (144, 146) differing from the other spacer element (220, 222), in particular with regard to the form and/or with regard to the dimensions and/or its substance composition.

5. The circuit arrangement (100) of claim 1, wherein the first edge terminal region (120) of the pnp transistor (102) comprises the same material as the further edge terminal region (172) of the pnp transistor (102) and/or as a base terminal region (210, 212) of the npn transistor (104), preferably p-doped polycrystalline silicon, and/or wherein a terminal region (158, 164) for the connection of a doped buried layer (110) between the pnp transistor (102) and the substrate (108) comprises the same material as a first edge terminal region (204) of the npn transistor (104) and/or as a further edge terminal region (188) of the npn transistor (104), preferably n-doped polycrystalline silicon.

6. The circuit arrangement (100) of claim 1, wherein the substrate (108) contains p-doped silicon, and/or wherein the base terminal region (139) is a polycrystalline silicon layer, which is preferably n-doped, anciior wherein the cutout (142) of the base terminal region (139) and the cutout (200) of the insulating layer (143) lie in one plane, and/or wherein the base terminal region (139) is covered by an electrically insulating covering layer (140), and/or wherein the substrate (108) contains an n type epitaxial layer (126).

7. The circuit arrangement (100) of claim 1, wherein the first edge region (114) that is further away from the cutout (142) in the base terminal region (139) or both edge regions (114, 118) of the pnp transistor (102) have the same contour form as said cutout (142), and/or wherein the first edge region (182) of the npn transistor (104) that is further away from the cutout (200) in the insulating layer (143) or both edge regions (182, 186) of the npn transistor (104) also have the same contour form as the cutout (200) in the insulating layer (143).

8. The circuit arrangement (100) of claim 1, wherein at least one metallic contact (150, 154) or at least one metal containing contact adjoins the base terminal region (139).

9. The circuit arrangement (100) of claim 1, wherein the pnp transistor (102) is formed as a multi-emitter transistor containing at least two cutouts above base regions of the pnp transistor (102), in which is arranged in each case a part of an edge terminal region near the substrate, said edge terminal region also containing a part which is remote from the substrate, is arranged outside the cutout and overlaps the base terminal region (139).

10. The circuit arrangement (100) of claim 1, wherein the dopings are of the opposite doping type to the doping types defined in claim 1.

11. A method for fabricating an integrated circuit arrangement (100) which contains at least one npn transistor (104) containing, in the following order in a manner adjoining one another, a first n-doped edge region (128) a p-doped base region (184) and a further n-doped edge region (186) and which contains at least one pnp transistor (102) containing, in the following order in a manner adjoining one another, a first p-doped edge region (114), an n-doped base region (116) and a further p-doped edge region (118), the method comprising the following method acts, which are implemented without restrictions by the order prescribed:

applying an electrically conductive layer (139) to a substrate (108), applying an electrically insulating covering layer (140) after the application of the electrically conductive layer (139), joint patterning of the electrically conductive layer (139) and of the covering layer (140) to produce at least one cutout (142), below which the base region of the pnp transistor (102) has been arranged, applying an electrically insulating insulating layer (143) after the patterning of the electrically conductive layer (139), patterning of the insulating layer (143) to produce at least one further cutout (200), below which the base region (184) of the npn transistor (104) has been arranged or is arranged.

12. The method of claim 11, further comprising:

producing spacer elements (144, 146) in the cutout (142) of the electrically conductive layer (139) starting from the insulating layer (143) before the production of the further cutout (200).

13. The method of claim 11, further comprising:

applying a terminal layer made of electrically conductive material or material that can be converted into such a material before the production of the further cutout (200), patterning of the terminal layer to produce a first edge terminal region (120) for the further edge region (118) of the npn transistor (102) in the cutout (142) and in a manner overlapping the covering layer (140) outside the cutout (142), and preferably to simultaneously produce at least a further edge terminal region (172) of the further edge region (114) of the pnp transistor (102).

* * * * *